(12) United States Patent
Mueller

(10) Patent No.: US 11,196,379 B2
(45) Date of Patent: Dec. 7, 2021

(54) SYSTEM FOR DETECTION AND ALGORITHMIC AVOIDANCE OF ISOLATION FAILURES IN ELECTRIC MOTORS

(71) Applicant: Infineon Technologies Austria AG, Villach (AT)

(72) Inventor: Clemens Mueller, Munich (DE)

(73) Assignee: Infineon Technologies Austria AG

( * ) Notice: Subject to any disclaimer, the term of this patent is extended or adjusted under 35 U.S.C. 154(b) by 0 days.

(21) Appl. No.: 16/812,901

(22) Filed: Mar. 9, 2020

(65) Prior Publication Data

US 2021/0281207 A1    Sep. 9, 2021

(51) Int. Cl.
| | |
|---|---|
| *H02P 1/30* | (2006.01) |
| *H02P 27/08* | (2006.01) |
| *H02K 3/40* | (2006.01) |
| *H02P 23/00* | (2016.01) |

(52) U.S. Cl.
CPC ............ *H02P 27/085* (2013.01); *H02K 3/40* (2013.01); *H02P 23/0018* (2013.01)

(58) Field of Classification Search
CPC ...... H02P 27/085; H02P 23/0018; H02P 6/28; H02K 3/40
See application file for complete search history.

(56) References Cited

U.S. PATENT DOCUMENTS

| | | |
|---|---|---|
| 6,262,550 B1 | 7/2001 | Kliman et al. |
| 2010/0295494 A1 | 11/2010 | Takeuchi et al. |
| 2011/0006802 A1* | 1/2011 | Younsi .................. H01F 38/28 324/765.01 |
| 2020/0389116 A1 | 12/2020 | Miyama et al. |

FOREIGN PATENT DOCUMENTS

| | | | |
|---|---|---|---|
| JP | 2013068579 A | 4/2013 | |
| JP | 2014027763 A | 2/2014 | |

(Continued)

OTHER PUBLICATIONS

Sylvain Humbert, "Detection of Electrical Discharges in Bearings". SKF Maintenance Products, Nov. 2008, [Retrieved online Jan. 23, 2020], URL: <https://www.ibtinc.com/artman/uploads/1/skf_eddpen_whitepaper.pdf>.

(Continued)

*Primary Examiner* — Karen Masih
(74) *Attorney, Agent, or Firm* — Design IP

(57) ABSTRACT

A motor monitoring system includes a motor unit, a plurality of sensors, and a motor controller. The motor unit includes a motor housing and a motor arranged within the motor housing. The motor includes a stator with a plurality of stator poles each having a corresponding phase coil. The plurality of sensors are arranged within the motor housing and are configured to: measure a first characteristic related to partial discharges that occur at one or more phase coils, and generate sensor data based on the measured first characteristic. The motor controller is configured to generate a plurality of pulse width modulation (PWM) control signals for controlling phase voltages of the motor, detect the partial discharges at at least one of the phase coils based on the sensor data, and adjust at least one PWM control signal of the plurality of PWM control signals based on the detected partial discharges.

20 Claims, 4 Drawing Sheets

(56) References Cited

FOREIGN PATENT DOCUMENTS

JP        2014045590 A    3/2014
WO       2019163098 A1   8/2019

OTHER PUBLICATIONS

Thibaud Plazenet, et al., "An Overview of Shaft Voltages and Bearing Currents in Rotating Machines". IEEE Industry Applications Society Annual Meeting, Oct. 2006, pp. 1-8.
Marek Florkowski, et al., "Partial Discharges in Insulating Systems of Low Voltage Electric Motors Fed by Power Electronics—Twisted-Pair Samples Evaluation". MDPI, Energies, Feb. 26, 2019, vol. 12, Issue 5, pp. 1-19.

* cited by examiner

SYSTEM FOR DETECTION AND ALGORITHMIC AVOIDANCE OF ISOLATION FAILURES IN ELECTRIC MOTORS

FIELD

The present disclosure relates generally to devices and to methods for driving an electric motor, and, more particularly, to monitoring a characteristic of the electric motor.

BACKGROUND

Modern variable speed drives (VSD) are operated by power-electronic switching devices such as Si-MOSFETs or IGBTs to create the electric motor's electrical field by means of pulse-width modulation (PWM). Today, typical PWM switching frequencies are in the range between 20 kHz and 40 kHz. Next generation power-electronic switching devices based on wide-band-gap semiconductors, such as silicon carbide (SiC) or gallium nitride (GaN), allow for significantly higher PWM frequencies, even beyond 100 kHz. As a result, electric motors can be operated at higher field frequencies, leading to a higher supported power range at smaller or similar form factors compared to traditional electric motors due to higher rotational speed of the motor (i.e., a motor's rated power is the product of the motor's torque times rotational speed).

However, as a result of higher switching frequencies, the rise/fall slopes of the PWM signal further increase the effect of reflections caused by the transmission lines, leading to critical over-voltages within the motor coils and the feeding motor cables. These over-voltages may lead to partial discharges, which may over time destroy the bearings between the stator and the rotor of the motor.

In particular, a stator has a core and multiple stator poles that are coupled to the core. Each stator pole has a field winding (i.e., a phase coil or a motor coil) and are wound in such a way that, when energized, form alternating north and south magnetic poles. Each stator winding is highly insulated using isolation material because of the high voltage induced in it. For example, the isolation material may be wrapped around the phase coil, the isolation material may coat the wire of the phase coil, or a phase coil may be inserted into a slot that is lined with isolation material.

The discharges on the motor's phase coils might lead to a full "corona effect"-like glowing of the phase coils which—over time—weakens the isolation material of the phase coils. Finally, the corona effect caused by partial discharges could result in fully damaged isolation material leading to short circuits within or between the phase coils and motor housing.

It is therefore important to identify the occurrence of partial discharges within an electric motor as early as possible and to take preventive measures on the motor control during operation to reduce or prevent the occurrence of partial discharges while still operating the motor within its target application.

Therefore, an improved device capable of identifying and reducing the occurrence of partial discharges may be desirable.

SUMMARY

One or more embodiments provide a motor monitoring that includes a motor unit, a plurality of first sensors, and a motor controller. The motor unit includes a motor housing and a motor arranged within the motor housing. The motor includes a stator with a plurality of stator poles each having a corresponding phase coil of a plurality of phase coils coupled thereto, where each of the plurality of phase coils is coupled to a corresponding phase load path of a plurality of phase load paths that supply a plurality of phase voltages for diving the motor. The plurality of first sensors are arranged within the motor housing and are configured to: measure a first characteristic related to partial discharges that occur at one or more of the plurality of phase coils, and generate first sensor data based on the measured first characteristic. The motor controller is configured to generate a plurality of pulse width modulation (PWM) control signals for controlling the plurality of phase voltages, receive the first sensor data from the plurality of first sensors, detect the partial discharges at at least one of the plurality of phase coils based on the first sensor data, and adjust at least one PWM control signal of the plurality of PWM control signals based on the detected partial discharges.

One or more embodiments provide a method for monitoring a motor, including: supplying, via a plurality of phase load paths, a plurality of phase voltages to a plurality of phase coils for diving the motor, where each of the plurality of phase coils are arranged at a corresponding stator pole of a plurality of stator poles and is coupled to a corresponding phase load path of the plurality of phase load paths; measuring, via a plurality of first sensors, a first characteristic related to partial discharges that occur at one or more of the plurality of phase coils; generating, via a plurality of first sensors, first sensor data based on the measured first characteristic; generating, via a motor controller, a plurality of pulse width modulation (PWM) control signals for controlling the plurality of phase voltages; receiving, via the motor controller, the first sensor data from the plurality of first sensors; detecting, via a motor controller, the partial discharges at at least one of the plurality of phase coils based on the first sensor data; and adjusting, via a motor controller, at least one PWM control signal of the plurality of PWM control signals based on the detected partial discharges.

BRIEF DESCRIPTION OF THE DRAWINGS

Embodiments are described herein making reference to the appended drawings.

DETAILED DESCRIPTION

Figure 1A:
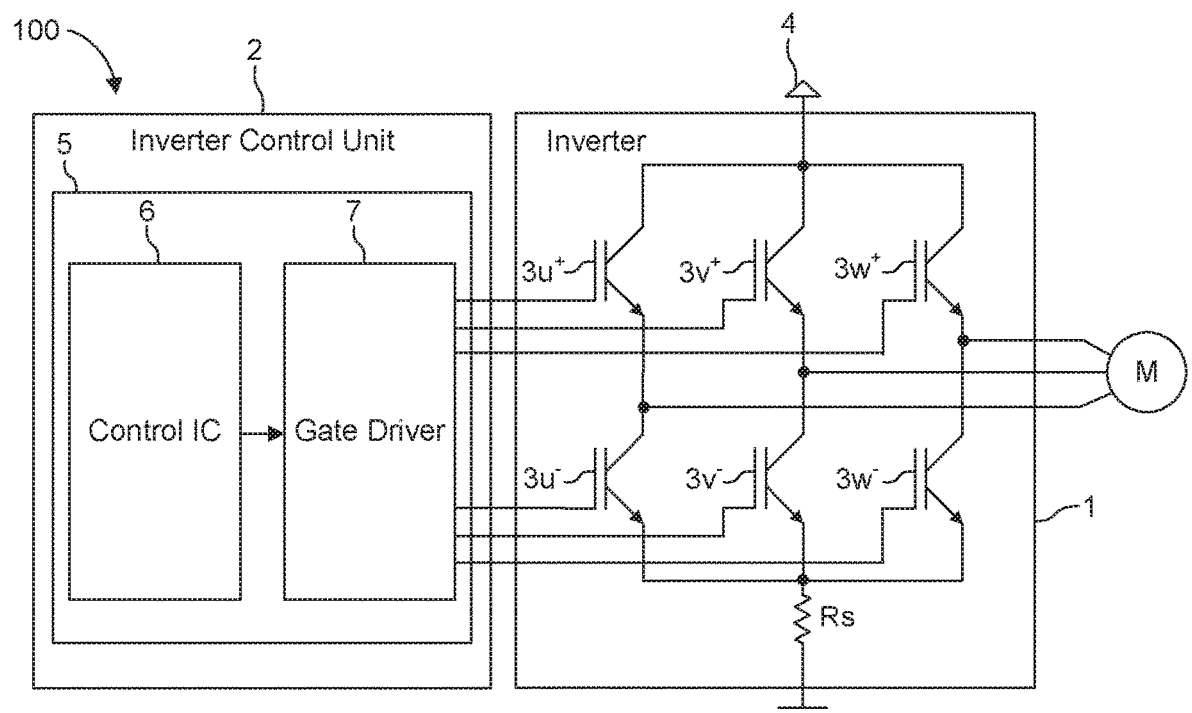
FIG. 1A is a schematic block diagram illustrating a motor control actuator of a power semiconductor device according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "above", "front", "behind", "back", "leading", "trailing", etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope defined by the claims. The following detailed description, therefore, is not to be taken in a limiting sense.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The term "substantially" may be used herein to account for small manufacturing tolerances (e.g., within 5%) that are deemed acceptable in the industry without departing from the aspects of the embodiments described herein.

Depending on certain implementation requirements, a storage medium may include a RAM, a ROM, a PROM, an EPROM, an EEPROM, a FLASH memory, or any other medium having electronically readable control signals stored thereon, which cooperate (or are capable of cooperating) with a programmable computer system such that the respective method is performed. Therefore, a storage medium may be regarded as a non-transitory storage medium that is computer readable.

Additionally, instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein refers to any of the foregoing structure or any other structure suitable for implementation of the techniques described herein. In addition, in some aspects, the functionality described herein may be provided within dedicated hardware and/or software modules. Also, the techniques could be fully implemented in one or more circuits or logic elements. A "controller," including one or more processors, may use electrical signals and digital algorithms to perform its receptive, analytic, and control functions, which may further include corrective functions.

A sensor may refer to a component which converts a physical quantity to be measured to an electric signal, for example, a current signal or a voltage signal. The physical quantity may, for example, be a current or a voltage at a shunt resistor in a single-shunt resistor system.

A signal processing circuit and/or a signal conditioning circuit may receive one or more signals from one or more components and perform signal conditioning or processing thereon. Signal conditioning, as used herein, refers to manipulating a signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a signal suitable for processing after conditioning.

Thus, a signal processing circuit may include an analog-to-digital converter (ADC) that converts the analog signal from the one or more sensor elements to a digital signal. The signal processing circuit may also include a digital signal processor (DSP) that performs some processing on the digital signal.

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor structure configured to conduct a load current along a load current path between two load terminal structures of the device. Further, the load current path may be controlled by means of a control electrode, sometimes referred to as gate electrode. For example, upon receiving a corresponding control signal from, e.g., a driver unit, the control electrode may set the power semiconductor device in one of a conducting state and a blocking state. A control signal may by a voltage signal or a current signal having a controlled value.

A power transistor is a power semiconductor device that may be used to drive a load current. For example, an IGBT is turned "ON" or "OFF" by activating and deactivating its gate terminal. Applying a positive input voltage signal across the gate and the emitter will keep the device in its "ON" state, while making the input gate signal zero or slightly negative will cause it to turn "OFF". There is a turn-on process and a turn-off process for switching the power transistor on and off. During the turn-on process, a gate driver integrated circuit (IC) may be used to provide (source) a gate current (i.e., an on current) to the gate of the power transistor in order to charge the gate to a sufficient voltage to turn on the device. In contrast, during the turn-off process, the gate driver IC is used to draw (sink) a gate current (i.e., an off current) from the gate of the power transistor in order to discharge the gate sufficiently to turn off the device. A current pulse may be output from the gate driver IC as the control signal according to a pulse width modulation (PWM) scheme. Thus, the control signal may be switched between an ON current level and an OFF current level during a PWM cycle for controlling a power transistor. This in turn charges and discharges the gate voltage to turn on and off the power transistor, respectively.

In particular, the gate of a power transistor is a capacitive load, and the turn ON current (i.e., gate source current) and the turn OFF current (i.e., gate sink current) are specified as the initial current when a switching event is initiated. During a turn OFF event, after some small amount of time (small compared to the PWM period), the gate current decreases and reaches a zero value when the gate reaches 0V. During a turn ON event, after some small amount of time (small compared to the PWM period), the gate current decreases and reaches a zero value when the gate reaches 15V.

Transistors may include Insulated Gate Bipolar Transistors (IGBTs) and Metal Oxide Semiconductor Field Effect Transistors (MOSFETs) (e.g., Si MOSFETs or SiC MOSFETs). While IGBTs may be used as an example in the embodiments below, it will be appreciated that MOSFETs may be substituted for the IGBTs and vice versa. In this context, when substituting a MOSFET for an IGBT, a MOSFET's drain may be substituted for an IGBT's collector, the MOSFET's source may be substituted for the IGBT's emitter, and the MOSFETs drain-source voltage $V_{DS}$ may be substituted for the IGBT's collector-emitter voltage $V_{CE}$ in any one of the examples described herein. Thus, any IGBT module may be substituted by a MOSFET module and vice versa.

Specific embodiments described in this specification pertain to, without being limited thereto, a power semiconductor device that may be used within a power converter or a power supply. Thus, in an embodiment, the power semiconductor device may be configured to carry a load current that is to be supplied to a load and/or, respectively, that is provided by a power source. For example, the semiconductor device may comprise one or more power semiconductor cells, such as a monolithically integrated diode cell, and/or a monolithically integrated transistor cell. Such diode cell and/or such transistor cells may be integrated in a power semiconductor module.

Power semiconductor devices that include transistors which are suitably connected to form half-bridges are commonly used in the field of power electronics. For example, half-bridges may be used for driving electric motors or switched mode power supplies.

For example, a multi-phase inverter is configured to provide multi-phase power by supplying multiple phase loads (e.g., a three-phase motor). For instance, three-phase power involves three symmetrical waves (e.g., sine waves or rectangular waves) that are 120 electrical degrees out of phase with one another. In a symmetric three-phase power supply system, three conductors (i.e., phase transmission lines or phase load paths) each carry an alternating current (AC) of the same frequency and voltage amplitude relative to a common reference but with a phase difference of one third the period. Due to the phase difference, the voltage on any conductor reaches its peak at one third of a cycle after one of the other conductors and one third of a cycle before the remaining conductor. This phase delay gives constant power transfer to a balanced linear load. It also makes it possible to produce a rotating magnetic field in an electric motor.

In a three-phase system feeding a balanced and linear load, the sum of the instantaneous currents of the three conductors is zero. In other words, the current in each conductor is equal in magnitude to the sum of the currents in the other two, but with the opposite sign. The return path for the current in any phase conductor is the other two phase conductors. The instantaneous currents result in a current space vector.

A three-phase inverter includes three inverter legs, one for each of the three phases, and each inverter leg is connected to a direct current (DC) voltage source in parallel to each other. Each inverter leg includes a pair of transistors, for example, arranged in a half-bridge configuration for converting DC to AC. In other words, each inverter leg includes two complementary transistors (i.e., a high-side transistor and a low-side transistor) connected in series and which switch on and off complementary to the each other for driving a phase load. However, multi-phase inverters are not limited to three phases, and may include two phases or more than three phases, with an inverter leg for each phase.

FIG. 1A is a schematic block diagram illustrating a motor control actuator 100 of a power semiconductor device according to one or more embodiments. In particular, the motor control actuator 100 is a variable speed drive (VSD) controller that includes a power inverter 1 and an inverter control unit 2. The inverter control unit 2 behaves as a motor control unit and thus may also be referred to as a motor controller or a motor control IC. The motor control unit may be a monolithic IC or may be split into a microcontroller and a gate driver on two or more ICs.

The motor control actuator 100 is further coupled to a three-phase motor M, that includes three phases U, V, and W. The power inverter 1 is a three-phase voltage generator configured to provide three-phase power by supplying three phase voltages to drive the motor M. It will be further appreciated that the power inverter 1 and the inverter control unit 2 may be placed on a same circuit board, or on separate circuit boards.

Deviations in both magnitude and phase may cause a loss in power and torque in the motor M. Therefore, the motor control actuator 100 may be configured to monitor and control the magnitude and phase of the voltages supplied to the motor M in real-time to ensure the proper current balance is maintained based on a feedback control loop. Open loop motor control units also exist and may be implemented.

The power inverter 1 for a three-phase motor M includes a switching array of six transistor modules 3u+, 3u−, 3v+, 3v−, 3w+, and 3w− (collectively referred to as transistor modules 3) arranged in complementary pairs. Each complementary pair constitutes one inverter leg that supplies a phase voltage to the three-phase motor M. Thus, each inverter leg includes an upper (high-side) transistor module 3 and a lower (low-side) transistor module 3. Each transistor module may include one power transistor and may also include a diode (not illustrated). Thus, each inverter leg includes an upper transistor and a lower transistor. Load current paths U, V, and W extend from an output of each inverter leg (i.e., the output of each half-bridge) located between complementary transistors and are configured to be coupled to a load, such as motor M. The power inverter 1 is coupled to a DC power supply 4 (e.g., a battery or a diode bridge rectifier) and to the inverter control unit 2.

In this example, the inverter control unit 2 includes a motor control circuit and the gate driver circuit for controlling the switching array. In some examples, the inverter control unit 2 may be monolithic in which the motor control circuit and gate driver circuit are integrated onto a single die. In other examples, the motor control circuit and gate driver circuit may be partitioned as separate ICs. A "monolithic" gate driver is a gate driver on a single silicon chip and may be further made with specific high voltage (HV) technology. Furthermore, the gate driver IC may be integrated on the power inverter 1.

The motor controller performs the motor control function of the motor control actuator 100 in real-time and transmits PWM control signals to a gate driver. Motor control functions can include either controlling a permanent magnet motor or an induction motor and can be configured as a sensorless control not requiring the rotor position sensing, as is the case with a sensor based control with Hall sensors and/or an encoder device. Alternatively, the motor control function may include a combination of both sensor based control (e.g., used at lower rotor speeds) and sensorless control (e.g., used at higher rotor speeds).

For example, the inverter control unit 2 includes a controller and driver unit 5 that includes a microcontroller unit (MCU) 6 as the motor controller and a gate driver 7 for generating driver signals for controlling the transistors of each transistor module 3. Thus, load current paths U, V, and W may be controlled by the controller and driver unit 5 by means of controlling the control electrodes (i.e., gate electrodes) of the transistors 3. For example, upon receiving a PWM control signal from the microcontroller, the gate driver IC may set a corresponding transistor in one of a conducting state (i.e., on-state) or a blocking state (i.e., off-state).

The gate driver IC may be configured to receive instructions, including the power transistor control signals, from the microcontroller, and turn on or turn off respective transistors 3 in accordance with the received instructions and control signals. For example, during the turn-on process of a respective transistor 3, the gate driver IC may be used to provide (source) a gate current to the gate of the respective transistor 3 in order to charge the gate. In contrast, during the turn-off process, the gate driver IC may be used to draw (sink) a gate current from the gate of the transistor 3 in order to discharge the gate.

The inverter control unit 2 or the controller and driver unit 5 itself may include a PWM controller, an ADC, a DSP, and/or a clock source (i.e., a timer or counter) used in implementing a PWM scheme for controlling the states of each transistor, and, ultimately, each phase current provided on the respective load current paths U, V, and W.

In particular, the microcontroller 6 of the controller and driver unit 5 may use a motor control algorithm, such as a Field Oriented Control (FOC) algorithm, for providing current control in real-time for each phase current output to a multi-phase load, such a multi-phase motor. Thus, the field-oriented control loop may be referred to as a current control loop.

For example, during FOC, a motor phase current should be measured such that an exact rotor position can be determined in real-time. To implement the determination of the motor phase current, the microcontroller 6 may employ an algorithm (e.g., space vector modulation (SVM), also referred as space vector pulse width modulation (SVPWM)) that uses single-shunt current sensing.

Furthermore, the switches 3 (i.e., transistors) of the power inverter 1 are controlled so that at no time are both switches in the same inverter leg turned on or else the DC supply would be shorted. This requirement may be met by the complementary operation of the switches 3 within an inverter leg according to the motor control algorithm.

Figure 1B:
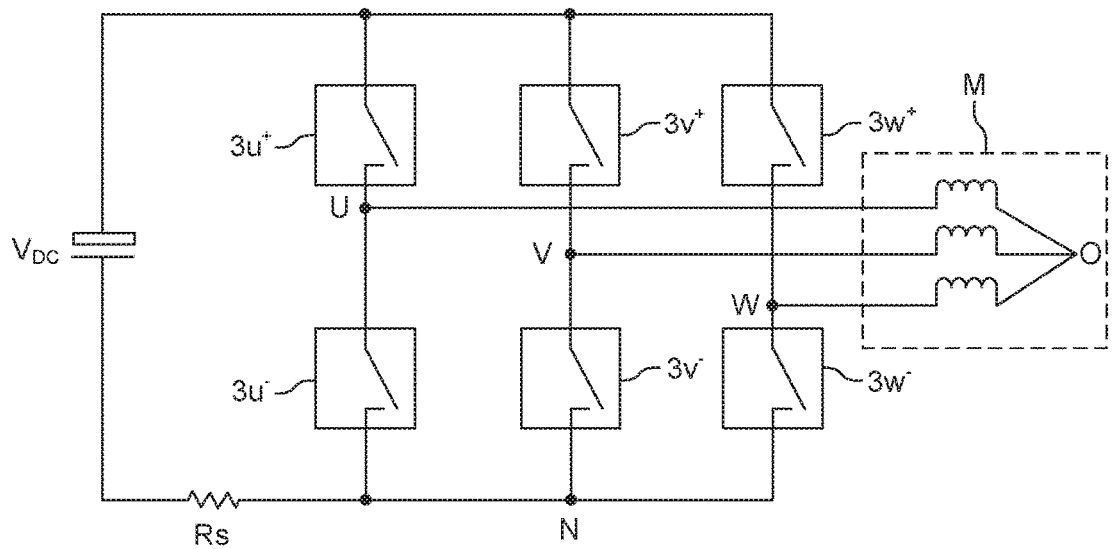
FIG. 1B is a schematic diagram illustrating a power inverter utilizing single-shunt current sensing according to one or more embodiments.

FIG. 1B is a schematic diagram illustrating a power inverter 1 utilizing single-shunt current sensing according to one or more embodiments. In particular, the power inverter 1 includes a shunt resistor Rs placed on the negative DC link of the power inverter 1. The transistors $3_{u+}$, $3_{u-}$, $3_{v+}$, $3_{v-}$, $3_{w+}$, and $3_{w-}$ are represented as switches and the motor M is shown with a winding for each of its phases. Here, UO represents the line to neutral voltage from bridge middle point U to motor neutral point O; UN represents the U bridge voltage from bridge middle point U to the negative bus supply rail N; UV represents the line to line voltage from U phase to V phase; VW represents the line to line voltage from V phase to W phase; and WV represents the line to line voltage from W phase to V phase.

The microcontroller 6 in FIG. 1A may receive samples of the current taken from the shunt resistor Rs and then use an algorithm (i.e., software) to re-construct the three-phase current in real-time. For example, SVPWM is a vector control based algorithm that requires the sensing of the three motor phase currents. By using the single-shunt resistor Rs, DC-link current pulses are sampled at exactly timed intervals. A voltage drop on the shunt resistor Rs may be amplified by an operational amplifier inside inverter control unit 2 and shifted up, for example, by 1.65V. The resultant voltage may be converted by an ADC inside inverter control unit 2. Based on the actual combination of switches, the three-phase currents of the motor M are reconstructed using the SVPWM algorithm. The ADC may measure the DC-link current during the active vectors of the PWM cycle. In each sector, two phase current measurements are available. The calculation of the third phase current value is possible because the three winding currents sum to zero.

SVPWM itself is an algorithm for the control of PWM in real-time. It is used for the creation of AC waveforms, and may be used to drive three-phase AC powered motors at varying speeds from a DC source using multiple switching transistors. While the examples herein are described in the context of three-phase motors, the examples are not limited thereto and may be applied to any load scheme.

In addition, it will be appreciated that other implementations other than a single-shunt resistor may be used for current sensing, such as inductive-based sensing or Hall-effect based sensing, as well as other motor control algorithms may be used to control the load, and that the embodiments described herein are not limited thereto.

Figure 2:
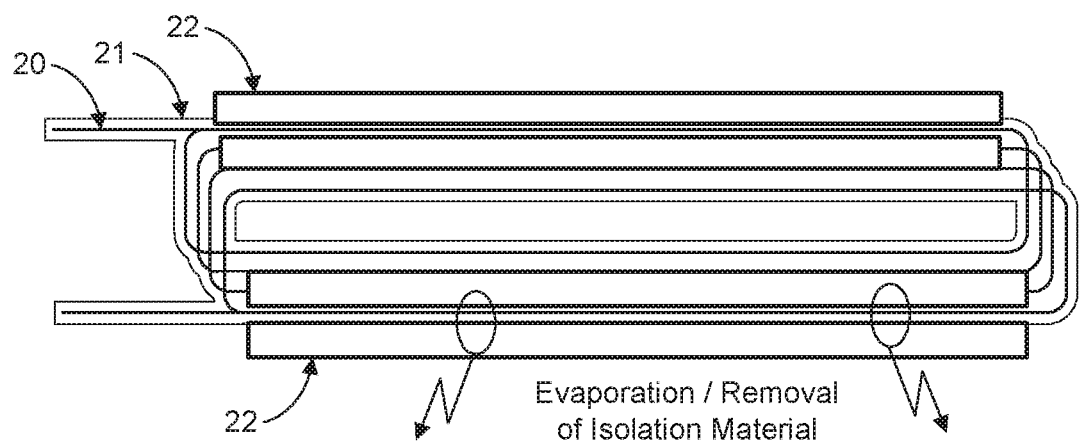
FIG. 2 illustrates a corona effect on a motor coil according to one or more embodiments.

FIG. 2 illustrates a corona effect on a motor coil 20 according to one or more embodiments. The motor coil 20 is a phase coil that is insulated with isolation material 21. For example, as shown, the conductor of the motor coil 20 may be coated with the isolation material 21. Due to high frequency PWM electrical field in the motor coils, ionization of the surrounding air occurs as result of partial discharges. This leads to corona effect 22 on the motor coil 20 causing generation of ozone gas and/or additional thermal stress on the coil winding in addition to already existing ohmic losses. This leads to evaporation or removal of isolation material 21 in regions at which the corona effect occurs. Eventually, the isolation material 21 becomes too weak, and short circuits within coils or between coils and the motor housing (e.g., the stator core) are possible.

Figure 3:
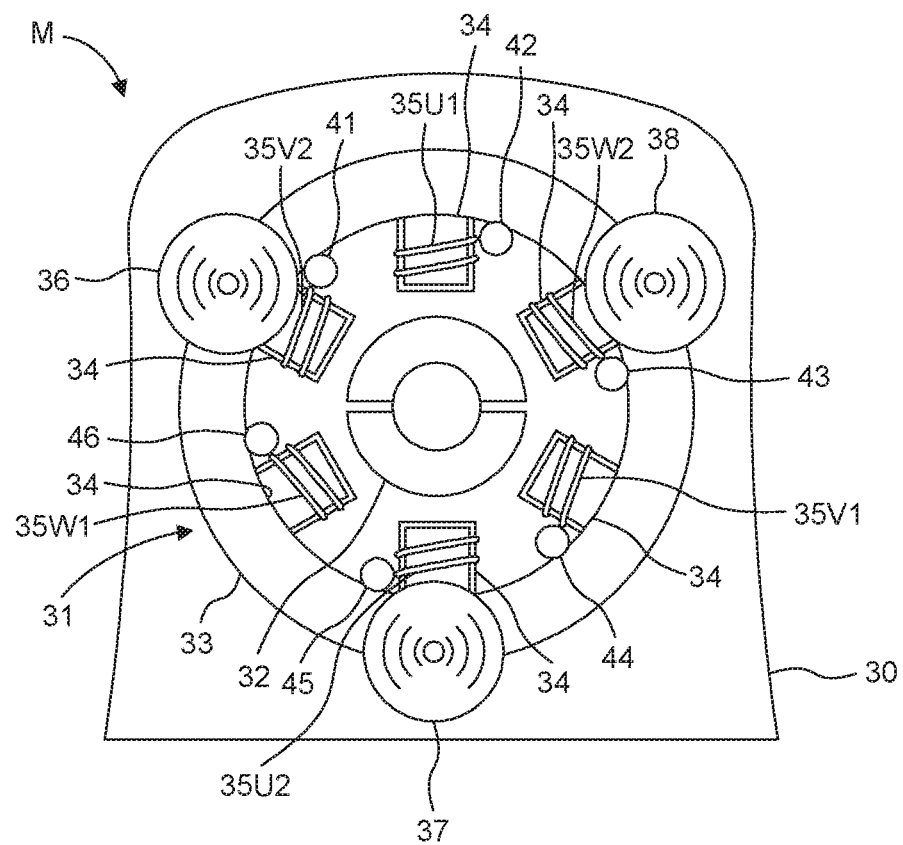
FIG. 3 illustrates a cross-sectional view of a motor according to one or more embodiments.

FIG. 3 illustrates a cross-sectional view of a motor M according to one or more embodiments. The motor M that includes a housing 30 and a stator 31 and a rotor 32 arranged within the housing 30. The stator 31 includes a core 33 and multiple stator poles 34 coupled to the core 33. Each stator pole 34 has a respective motor coil 35U1, 35U2, 35V1, 35V2, 35W1 and 35W2, with motor coils 35U1, 35U2 being a first phase pair, motor coils 35V1, 35V2 being a second phase pair, and motor coils 35W1, 35W2 being a third phase pair. The stator poles 34 are wound in such a way that, when energized, form alternative north and south magnetic poles. Each motor coil 35U1, 35U2, 35V1, 35V2, 35W1 and 35W2 is highly insulated because of the high voltage induced in it.

For a three-phase motor, the motor coils 35U1, 35U2, 35V1, 35V2, 35W1 and 35W2 can be connected to a three-phase AC input to create a magnetic field that rotates. For example, each phase load path U, V, and W may be wound around two oppositely arranged stator poles 34, such that when current flows through the phase load path, one stator pole of the phase pair is energized as a north pole and the other stator pole of the phase pair is energized as a south pole. The strength of the magnetic field, produced by a motor coil, increases and decreases with the increase and decrease of the alternating current flow. Furthermore, as the polarity of the poles rotates according to the three-phase AC input, so does the magnetic field.

The motor M further comprises a first set of sensors that includes at least three sensors 36, 37, and 38 that are arranged inside the motor housing and proximate to or adjacent to the stator poles 34 (i.e., proximate to the motor coils 35U1, 35U2, 35V1, 35V2, 35W1 and 35W2). For example, one or more sensors 36-38 may be located adjacent to a different one of the stator poles 34. The sensors 36-38 may be part of the stator housing and/or mounted to the core 33, each adjacent to a different one of the stator poles 34. Alternatively, one or more sensors 36-38 may be located between a different pair of stator poles 34. Again, in this case, the sensors 36-38 may be mounted to the core 33.

The sensors 36-38 may be either sound transducers (e.g., sensitive silicon microphones), pressure sensors (e.g., Micro-Electro-Mechanical System (MEMS)-based), or a combination thereof. A direct measurement of partial discharges could be achieved using sensitive microphones and/or pressure sensors mounted inside the motor housing 30 (i.e., close to the motor coils). Sensitive microphones may be used to sense the induced noise resulting from partial discharges in one or more of the motor coils. Pressure sensors may be used to sense pressure changes resulting from partial discharges in one or more of the motor coils. Thus, each sensor 36-38 should be placed close enough to a motor coil such that sound or pressure detection resulting from a partial discharge is possible. Using an array of three or more sensors will allow processing circuitry to triangulate the origin of the sound or the pressure change based on nose or pressure sensor data generated by the sensors, and thus localize (i.e., locate or determine) which of the motor coils 35U1, 35U2, 35V1, 35V2, 35W1 and 35W2 is exposed to partial discharges.

A second set of sensors 41-46 may also be included to support the sensing of sensors 36-38. In particular, sensors 41-46 may be gas sensors (e.g., ozone sensors) that perform ozone measurements or even multi-gas sensor measurements. Ozone is generated as a result of the partial discharges inside the motor housing. Thus, a presence or increased presence of ozone indicates that partial discharges are taking place on one or more motor coils.

Multi-gas sensors could also identify whether the isolation material 21 starts to evaporate as a result of partial discharges on one or more motor coils or as a result of a critical over-temperature occurring within the motor M as a whole. Thus, a presence of evaporated isolation material, alone or in combination with ozone detection, indicates that partial discharges are taking place on one or more motor coils. Extra monitoring of the over-temperature effect via the gas sensors 41-46 on the motor coils, in addition to sound and pressure measurements, might give an extra level of protection and may provide for advanced condition monitoring for electrical motors. Ozone measurements should be performed close to the motor coils (e.g., at each motor coil 35U1, 35U2, 35V1, 35V2, 35W1 and 35W2) or at an outlet of the motor housing used for the circulating cooling air. Any existence of generated ozone could be determined there. Thus, the number of gas sensors shown in FIG. 3 should not be treated as limiting, since as few as one or as many as six gas sensors (i.e., one for each stator pole) could be used in some embodiments.

Figure 4:
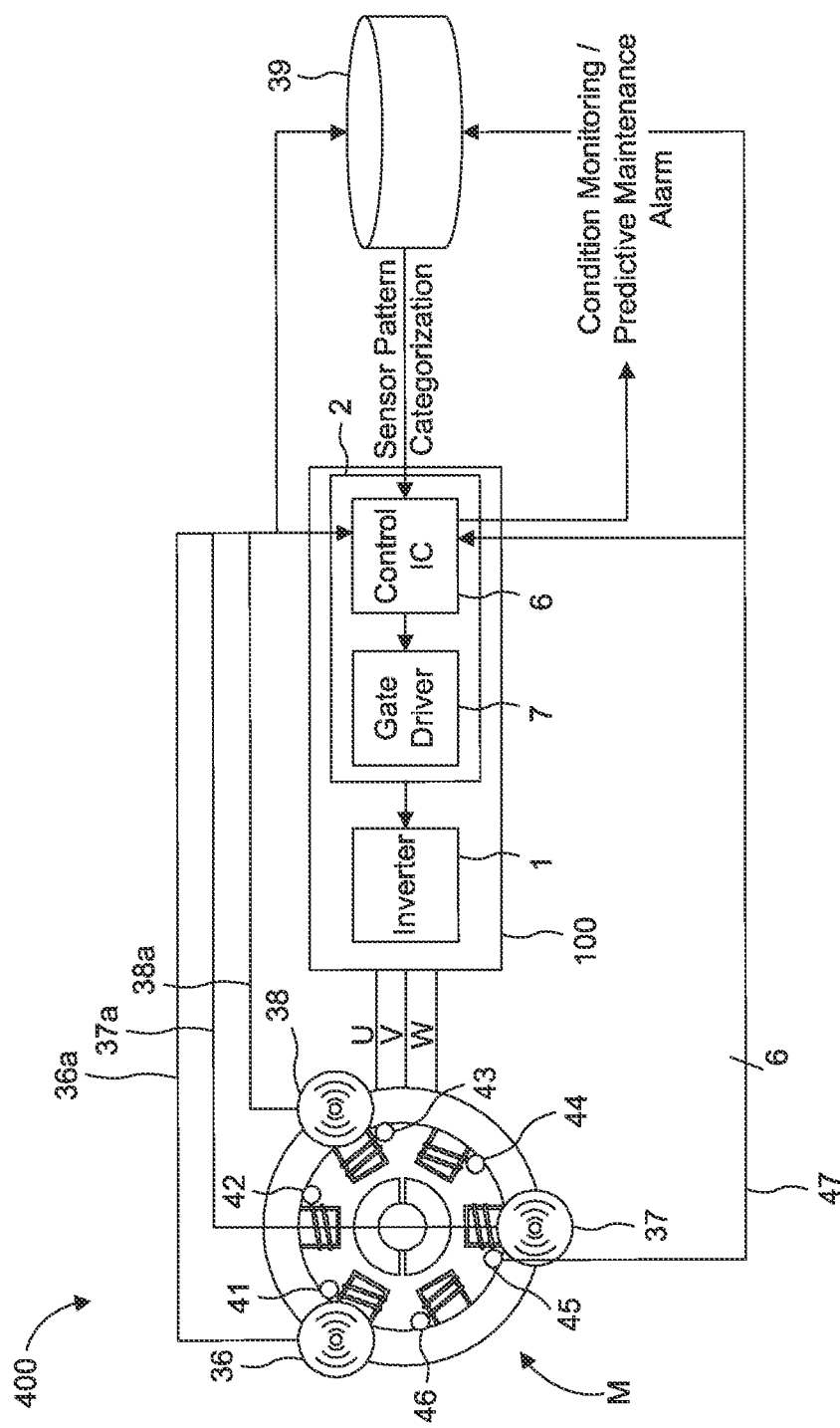
FIG. 4 illustrates schematic view of a partial discharge sensor system configured to detect partial discharges as a result of higher switching frequencies of motor coils according to one or more embodiments.

FIG. 4 illustrates a schematic view of a partial discharge sensor system 400 configured to detect partial discharges as a result of higher switching frequencies of motor coils according to one or more embodiments. In addition to the motor M, the senor system 400 includes the motor control actuator 100 and a partial discharges avoidance system 39. The partial discharges avoidance system 39 may be a computing system such as an artificial neural network that includes a memory device for storing machine health data.

The motor control actuator 100 is coupled to the motor coils 35U1, 35U2, 35V1, 35V2, 35W1 and 35W2 via phase load path U, V, and W. In addition, the inverter control unit 2 is coupled to the sensors 36, 37, and 38 via sensor feedback channels 36a, 37a, and 38a, respectively. Thus, the inverter control unit 2, and, more particularly, the microcontroller 6 of the inverter control unit 2, is configured to receive sensor data from the sensors 36-38 and localize (e.g., via sensor triangulation) one or more motor coils at which one or more partial discharges occur.

Additional feedback channels 47 are coupled to each of the gas sensors 41-47 at one end and to the microcontroller 6 at the other end. Thus, the microcontroller 6 is configured to receive sensor data from the gas sensors 41-46 in order to support the detection and localization of partial discharges as well as to monitor for certain conditions of the motor coils, the isolation material 21, and/or the motor M as a whole, including over-temperature conditions and determining a deterioration level of the isolation material 21 at a respective motor coil.

In response to detecting and localizing partial discharges, the microcontroller 6 is configured to take algorithmic counter measures to reduce the occurrence of partial discharges and the corona effect on the motor coils via a superposed control algorithm. The superposed control algorithm is "superposed" onto the normal operation control algorithm and overrides its function for a short period.

For example, by determining the corresponding motor coil from motor coils 35U1, 35U2, 35V1, 35V2, 35W1 and 35W2 at which partial discharges are occurring, the microcontroller 6 can further determine the corresponding motor phase U, V, or W. By determining the corresponding motor phase U, V, or W, the microcontroller 6 may suspend the PWM control signal for that specific motor phase until the partial discharges disappear. As a result, the gate driver 7 may turn off a high-side transistor 3 for the corresponding motor phase U, V, or W between during a detection period of partial discharges.

Figure 5A:
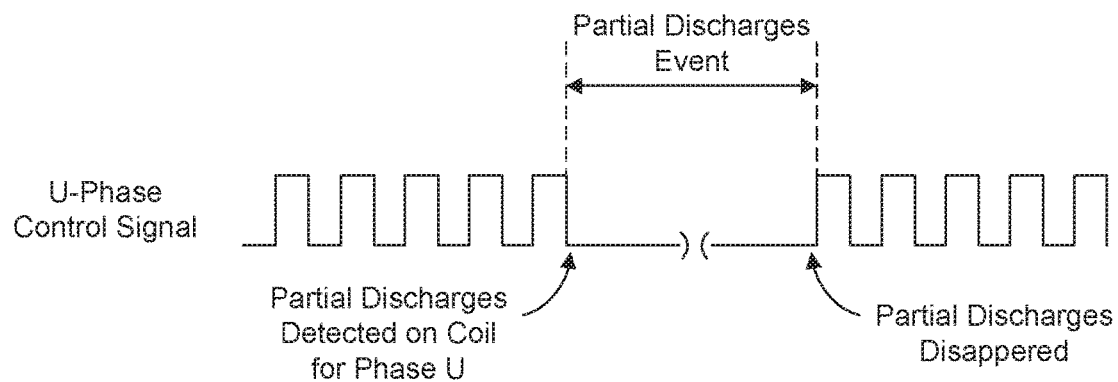
FIGS. 5A and 5B illustrate PWM control signals for a U motor phase according to one or more embodiments.
Figure 5B:
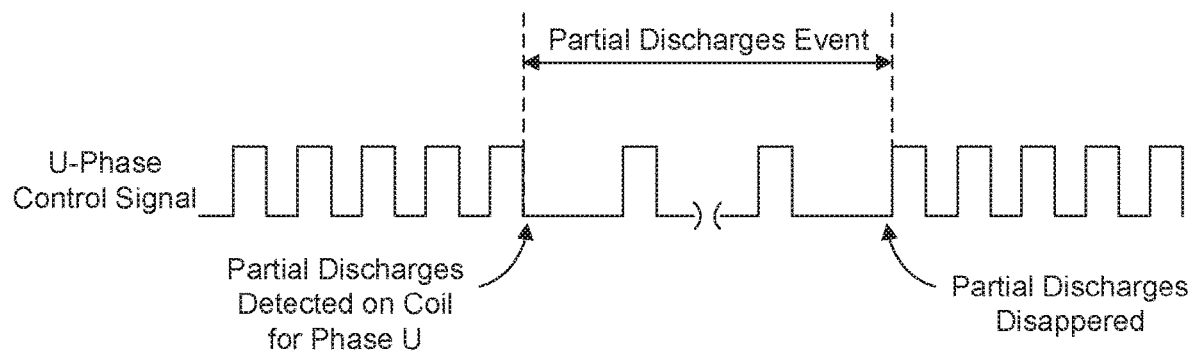

FIGS. 5A and 5B illustrate PWM control signals for a U motor phase according to one or more embodiments. The PWM control signal is used to control transistors 3u+ and 3u− and thus the current flowing through phase load path U. On a condition that the microcontroller 6 detects partial discharges at motor coils 35U1 and/or 35U2, the microcontroller 6 reduces the PWM frequency of the U-phase PWM control signal for a detection period (i.e., a partial discharges event period) representative of a time between detecting an occurrence of partial discharges and detecting a disappearance of the partial discharges on the corresponding motor coils 35U1 and/or 35U2. For example, as shown in FIG. 5B, the microcontroller 6 reduces the PWM frequency of the U-phase PWM control signal (i.e., PWM frequency is non-zero) for the detection period without completely suspending the U-phase PWM control signal. Alternatively, as shown in FIG. 5A, the microcontroller 6 may reduce the PWM frequency by completely suspending (i.e., PWM frequency is zero) the U-phase PWM control signal for the detection period Typically, this detection period will be in the millisecond range. After which, the microcontroller 6 resumes the normal operating PWM frequency of the reduced phase affording to the motor control algorithm. Similar action can also be taken for the PWM control signals of the remaining motor phases V and W in the event that partial discharges are detected at motor coils 35V1, 35V2, 35W1 and/or 35W2.

The microcontroller 6 may determine to suspend a PWM control signal based on a number of partial discharges detected over a predetermined time period. In other words, the microcontroller 6 may determine whether the number of detected partial discharges warrants suspension of the PWM control signal. This determination may be based on a comparison to a threshold number of partial discharges, by which the PWM control signal is suspended when the number of detected partial discharges is equal to or exceeds the threshold. Each time a PWM control signal is suspended, it may be referred to as a PWM suspension event.

As soon as the voltage slope dV/dt of the phase voltage is lowered at the motor coils for the affected motor phase(s) or even fully disabled for a shorter period, the root cause for causing the corona effect is removed. For electric drives, whose rotor inertia is big enough, the adaptive modification of the switching characteristic will not be noticeable. System inertia of bigger electrical motors (e.g., equal to or larger than 20 kW) will allow for these preventive actions without causing critical torque ripple to the rotating part in many application scenarios. For example, this method may be particularly advantageous for larger motors (e.g., equal to or larger than 20 kW) with sufficient rotor mass and corresponding rotor inertia that the rotor inertia is capable of maintaining rotor speed within a target range despite one or more motor phases being suspended for a short period of time. However, it will be appreciated that motor size may be only one factor in determining system inertia and prevention of critical torque ripple, and that the described system is not limited for use with a particular motor size. Moreover, as explained above, an alternative to suspending a motor phase, as shown in FIG. 5A, is to reduce the PWM frequency without completely suspending the motor phase, as shown in FIG. 5B. Doing so may help, even in smaller motors, maintain rotor speed within an acceptable margin to prevent critical torque ripple from occurring during the partial discharges event period. Furthermore, some torque ripple may be tolerable or may be compensated for by other means used in combination with the described system. Thus, the described embodiments may be used in any type or size of motor in which partial discharges occur.

Once partial discharges have been removed by the described system, it will then take some time until the ionization of the air around the motor coils advances again to a level where partial discharges become problematic again.

As soon as the voltage slope dV/dt of the phase voltage is lowered at the motor coils for the affected motor phase(s) or even fully disabled for a shorter period, the root cause for causing the corona effect is removed. For electric drives, whose rotor inertia is big enough, the adaptive modification of the switching characteristic will not be noticeable. System inertia of bigger electrical motors (e.g., larger than 20 kW) will allow for these preventive actions without causing critical torque ripple to the rotating part in many application scenarios. It will then take some time until the ionization of the air around the motor coils advances again to a level where partial discharges become problematic again. Thus, this method is particularly advantageous for larger motors (e.g., larger than 20 kW) with sufficient rotor mass and corresponding rotor inertia that the rotor inertia is capable of maintaining rotor speed despite one or more motor phases being suspended for a short period of time.

From the above-described configurations, monitoring data is retrieved under normal application conditions based on the sensor feedback from within the motor housing 30 via sound transducers, pressure sensors, ozone sensors, and/or multi-gas sensors. This sensor data is used to assess the normal operational state of the motor M under different load conditions and to teach/train an artificial neural network with expected "machine health data". As soon as ionized air leads to partial discharges on the coils a deviation from known-good state is observed on-the-fly and allows a smart motor controller to react accordingly.

The microcontroller 6 is further configured to perform condition monitoring and generate a predictive maintenance alarm signal in the event that maintenance should be performed on the motor M. Sensors 36-38 and 41-46 enable better monitoring capabilities with respect to the health status of the motor's coils than simply using current measurements. Condition monitoring is no longer limited to the moving parts of an electrical motor only (e.g., bearings). Instead, better machine adjustment according to fine-tuned motion profiles is possible. Thermal overstress might not be an issue for a motor as long as it does not cause any harm to mechanical and electrical parts. In particular, the motor coils are able to handle (short) thermal overstress, as long as the conducting material and the surrounding isolation material is not impacted. Having additional analysis capabilities for monitoring the beginning of isolation material weakening will allow the implementation of much more accurate mission profiles for an electric motor without the need for significant over-dimensioning.

In particular, the microcontroller 6 may use the sensor data from sensors 36-38 to determine how often of partial discharges occur (i.e., their frequency) and on which motor coils 35U1, 35U2, 35V1, 35V2, 35W1 and 35W2, track the number of instances partial discharges occur and on which motor coils, track the number of PWM suspension events that occur for each motor phase, and use that assessment to monitor for weaknesses, particularly with the isolation material of each motor coil. The microcontroller 6 may use the sensor data from gas sensors 41-46 to further support localizing and/or tracking of partial discharges amongst the motor coils 35U1, 35U2, 35V1, 35V2, 35W1 and 35W2 and monitoring the "health" of the isolation material 21 of each motor coil. For example, the gas sensors 41-46 may be used to track an amount of ozone gas and/or evaporated isolation material to determine a health status of the isolation material 21 of each motor coil. As a result of the condition monitoring, the microcontroller 6 is configured to predict (i.e., formulate a prediction) a failure in the isolation material 21 prior to its occurrence, and may signal an alarm that maintenance should be performed upon detection of a predicted failure. For example, the microcontroller 6 may generate an alarm signal on a condition that a degree of damage to the isolation material at a motor coil exceeds a threshold damage level.

The partial discharges avoidance system 39 may also be coupled to the sensors 36-38 and 41-46 for receiving sensor data therefrom to be used as deep learning training data. The partial discharges avoidance system 39 may be configured to adapt the PWM switching algorithm (i.e., the motor control algorithm) of the microcontroller 6 based on the sensor data in order to provide active (real-time) counter-measures against corona effects from partial discharges on the motor coils 35U1, 35U2, 35V1, 35V2, 35W1 and 35W2. For example, the partial discharges avoidance system 39 may provide a sensor pattern information such as a sensor pattern or a sensor pattern category to the microcontroller 6, which in turn adjusts the PWM switching algorithm of one or more motor phases based on the received sensor pattern information. In other words, one or more characteristics (e.g., duty cycle, frequency, and/or phase) of the PWM control signals for one or more of the motor phases U, V, and/or W may be adjusted.

For example, the partial discharges avoidance system 39 may categorize the sensor feedback from sensors 36-38 and possible also from sensors 41-46 using a trained artificial neural network, and provide the sensor pattern information to the microcontroller 6.

The microcontroller 6 may modify the PWM signaling for all or just a single motor phase (i.e., for one or more of the PWM control signals) based on the sensor pattern information in order to proactively prevent or reduce the occurrence of partial discharges at the motor coils. This may include adjusting (e.g., lowering) the PWM frequency or duty cycle for one or more PWM control signals for one or more motor phases U, V, and/or W. As soon as the voltage slope dV/dt of the phase voltage is lowered at the motor coils for the affected motor phase(s), the root cause for the corona effect is removed.

While various embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods. For example, the techniques described in this disclosure may be implemented, at least in part, in hardware, software, firmware, or any combination thereof. For example, various aspects of the described techniques may be implemented within one or more processors, including one or more microprocessors, DSPs, ASICs, or any other equivalent integrated or discrete logic circuitry, as well as any combinations of such components.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A motor monitoring system, comprising:
a motor unit comprising a motor housing and a motor arranged within the motor housing, wherein the motor comprises a stator with a plurality of stator poles each having a corresponding phase coil of a plurality of phase coils coupled thereto, wherein each of the plurality of phase coils is coupled to a corresponding phase load path of a plurality of phase load paths that supply a plurality of phase voltages for driving the motor;
a plurality of first sensors arranged within the motor housing, wherein the plurality of first sensors are configured to: measure a first characteristic related to partial discharges that occur at one or more of the plurality of phase coils, and generate first sensor data based on the measured first characteristic; and
a motor controller configured to generate a plurality of pulse width modulation (PWM) control signals for controlling the plurality of phase voltages, receive the first sensor data from the plurality of first sensors, detect the partial discharges at at least one of the plurality of phase coils based on the first sensor data, and adjust at least one PWM control signal of the plurality of PWM control signals based on the detected partial discharges.

2. The motor monitoring system of claim 1, wherein the motor controller is configured to adjust a PWM control signal of the plurality of PWM control signals in order to temporarily reduce a voltage slope of a phase voltage at a phase coil at which the partial discharges are detected.

3. The motor monitoring system of claim 1, wherein the motor controller is configured to adjust a PWM control signal of the plurality of PWM control signals in order to temporarily suspend a phase voltage at a phase coil at which the partial discharges are detected.

4. The motor monitoring system of claim 1, wherein the plurality of first sensors are microphones configured to measure noise induced by the partial discharges as the measured first characteristic.

5. The motor monitoring system of claim 4, wherein the motor controller is configured to localize a phase coil from among the plurality of phase coils at which the partial discharges occur based on the measured noise at each of the plurality of first sensors.

6. The motor monitoring system of claim 1, wherein the plurality of first sensors are pressure sensors configured to measure a pressure induced by the partial discharges as the measured first characteristic.

7. The motor monitoring system of claim 6, wherein the motor controller is configured to localize a phase coil from among the plurality of phase coils at which the partial discharges occur based on the measured pressure at each of the plurality of first sensors.

8. The motor monitoring system of claim 1, further comprising:
   at least one second sensor arranged within the motor housing and configured to measure at least one gas as a second characteristic related to the partial discharges that occur at one or more of the plurality of phase coils and generate second sensor data based on the at least one measured gas,
   wherein the motor controller is configured to detect the partial discharges at the at least one of the plurality of phase coils based on the second sensor data, and adjust the at least one PWM control signal of the plurality of PWM control signals based on the detected partial discharges.

9. The motor monitoring system of claim 8, wherein the at least one gas includes ozone gas generated from the partial discharges.

10. The motor monitoring system of claim 8, further comprising:
    isolation material arranged at each of the plurality of phase coils in order to isolate each of the plurality of phase coils,
    wherein the at least one gas includes evaporated isolation material that has evaporated due to the partial discharges.

11. The motor monitoring system of claim 8, wherein the motor controller is configured to localize a phase coil from among the plurality of phase coils at which the partial discharges occur based on the at least one measured gas.

12. The motor monitoring system of claim 8, further comprising:
    isolation material arranged at each of the plurality of phase coils in order to isolate each of the plurality of phase coils, wherein the partial discharges causes the isolation material to weaken,
    wherein the motor controller is configured to monitor a condition of the isolation material at each of the plurality of phase coils based on the second sensor data and generate an alarm signal on a condition that a degree of damage to the isolation material at at least one of the plurality of phase coils exceeds a threshold damage level.

13. The motor monitoring system of claim 1, further comprising:
    isolation material arranged at each of the plurality of phase coils in order to isolate each of the plurality of phase coils, wherein the partial discharges causes the isolation material to weaken,
    wherein the motor controller is configured to monitor a condition of the isolation material at each of the plurality of phase coils based on the first sensor data and generate an alarm signal on a condition that a degree of damage to the isolation material at at least one of the plurality of phase coils exceeds a threshold damage level.

14. The motor monitoring system of claim 1, further comprising:
    an artificial neural network configured to receive the first sensor data from the plurality of first sensors, predict the partial discharges based on the first sensor data to formulate a prediction, and adjust a PWM switching algorithm for the plurality of PWM control signals to reduce a number of occurrences of the partial discharges based on the prediction.

15. A method of monitoring a motor, comprising:
    supplying, via a plurality of phase load paths, a plurality of phase voltages to a plurality of phase coils for driving the motor, wherein each of the plurality of phase coils is arranged at a corresponding stator pole of a plurality of stator poles and is coupled to a corresponding phase load path of the plurality of phase load paths;
    measuring, via a plurality of first sensors, a first characteristic related to partial discharges that occur at one or more of the plurality of phase coils;
    generating, via a plurality of first sensors, first sensor data based on the measured first characteristic;
    generating, via a motor controller, a plurality of pulse width modulation (PWM) control signals for controlling the plurality of phase voltages;
    receiving, via the motor controller, the first sensor data from the plurality of first sensors;
    detecting, via the motor controller, the partial discharges at at least one of the plurality of phase coils based on the first sensor data; and
    adjusting, via the motor controller, at least one PWM control signal of the plurality of PWM control signals based on the detected partial discharges.

16. The method of claim 15, wherein adjusting the at least one PWM control signal comprises:
    adjusting a PWM control signal of the plurality of PWM control signals in order to temporarily reduce a voltage slope of a phase voltage at a phase coil at which the partial discharges are detected.

17. The method of claim 15, wherein adjusting the at least one PWM control signal comprises:
    adjusting a PWM control signal of the plurality of PWM control signals in order to temporarily suspend a phase voltage at a phase coil at which the partial discharges are detected.

18. The method of claim 15, wherein adjusting the at least one PWM control signal comprises:
    localizing a phase coil at which the partial discharges are detected from among the plurality of phase coils; and
    adjusting a PWM control signal of the plurality of PWM control signals that corresponds to the localized phase coil to eliminate the partial discharges at the localized phase coil.

19. The method of claim 15, further comprising:
    monitoring, via the motor controller, a condition of isolation material at each of the plurality of phase coils based on the first sensor data, wherein the isolation material is arranged at each of the plurality of phase coils in order to isolate each of the plurality of phase coils, wherein the partial discharges causes the isolation material to weaken; and
    generating, via the motor controller, an alarm signal on a condition that a degree of damage to the isolation material at at least one of the plurality of phase coils exceeds a threshold damage level.

20. The method of claim 15, further comprising:
receiving, via an artificial neural network, the first sensor data from the plurality of first sensors;
predicting, via an artificial neural network, the partial discharges based on the first sensor data to formulate a prediction; and
adjusting, via an artificial neural network, a PWM switching algorithm for the plurality of PWM control signals to reduce a number of occurrences of the partial discharges based on the prediction.

* * * * *